United States Patent
Schauwecker et al.

(10) Patent No.: US 6,369,464 B1
(45) Date of Patent: Apr. 9, 2002

(54) ACTIVE SHIELDED SUPERCONDUCTING ASSEMBLY WITH COMPENSATION OF MAGNETIC FIELD DISTURBANCES

(75) Inventors: Robert Schauwecker; Pierre-Alain Bovier, both of Zurich; Daniel M. Eckert, Duebendorf, all of (CH); Michael Westphal, Offenbach (DE)

(73) Assignee: Bruker AG, Faellanden (CH)

( * ) Notice: Subject to any disclaimer, the term of this patent is extended or adjusted under 35 U.S.C. 154(b) by 0 days.

(21) Appl. No.: 09/345,017

(22) Filed: Jul. 2, 1999

(51) Int. Cl.$^7$ ................................................. H04B 3/30
(52) U.S. Cl. ..................... 307/91; 335/216; 335/299; 335/301; 361/19
(58) Field of Search ................................ 307/91; 335/216, 335/299, 301; 324/309, 318, 319, 320; 361/19

(56) References Cited

U.S. PATENT DOCUMENTS

| 4,926,289 A | | 5/1990 | Reichert | |
|---|---|---|---|---|
| 4,974,113 A | | 11/1990 | Gabrielse et al. | |
| 5,235,282 A | * | 8/1993 | Overweg et al. | 324/309 |
| 5,329,266 A | * | 7/1994 | Soeldner et al. | 335/216 |
| 5,386,191 A | * | 1/1995 | McCarten et al. | 324/318 |
| 5,426,366 A | | 6/1995 | Overweg et al. | |
| 5,847,633 A | * | 12/1998 | Keller et al. | 361/19 |
| 5,900,794 A | * | 5/1999 | Palkovich et al. | 335/299 |
| RE36,782 E | * | 7/2000 | Brown et al. | 335/216 |

\* cited by examiner

*Primary Examiner*—Albert W. Paladini

(57) ABSTRACT

An actively shielded, superconducting magnet arrangement for the generation of a magnetic field in the direction of a z axis in a working volume arranged about z=0, having a radially inner and a radially outer coaxial coil system, wherein the two coil systems carry the same current and have dipole moments of the same magnitude, but of opposite directions, wherein parts of the radially outer coil system ($C_2'$) are electrically connected in series with the radially inner coil system ($C_1$) and wherein a first superconducting switch ($S_1$) is provided via which during operation a superconducting short circuit of a first current path of the magnet arrangement can be effected, is characterized in that a section (A') of the radially outer coil system ($C_2'$), which can be superconductingly short-circuited during operation via a further superconducting switch ($S_2$) is arranged symmetrically to the plane z=0 and that the further superconducting current path formed by the superconductingly short-circuited section is inductively decoupled from the other parts of the magnet arrangement connected in series. In this way, undesired side effects like an increase of the magnet drift or uncontrolled charging of the section (distortion with time of homogeneity, possible increase of the stray field, charging up to quenching) are avoided with simple means without the necessity of a current limiter.

17 Claims, 3 Drawing Sheets

Figure 1:
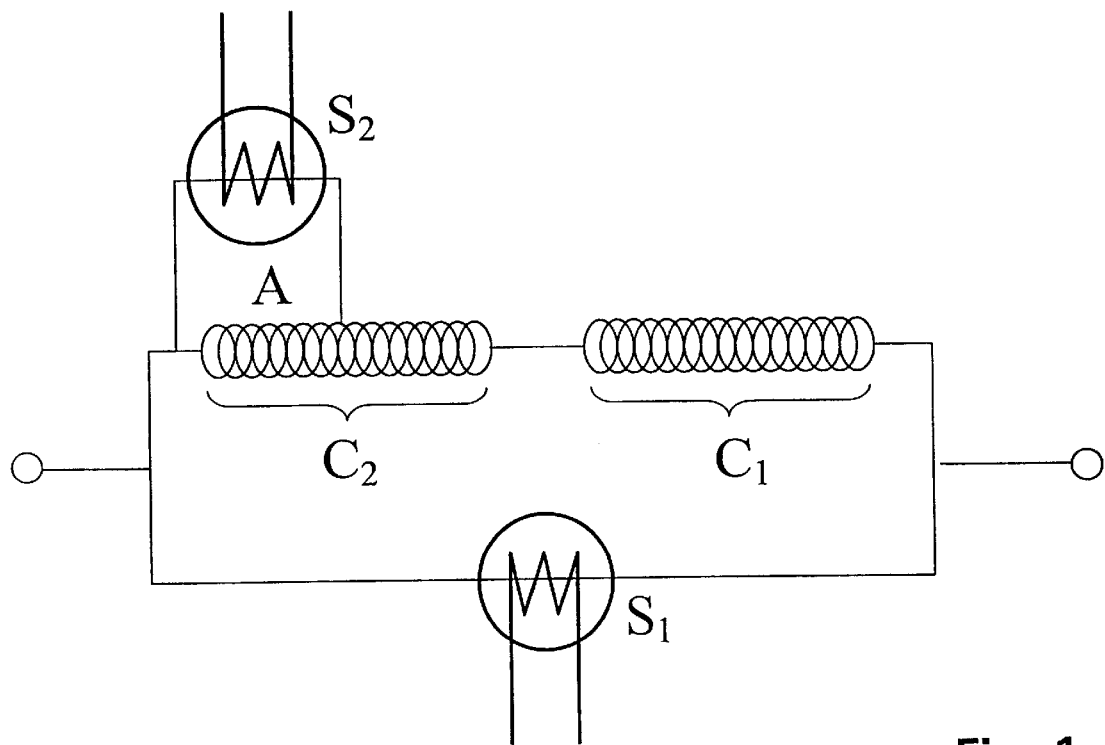

ACTIVE SHIELDED SUPERCONDUCTING ASSEMBLY WITH COMPENSATION OF MAGNETIC FIELD DISTURBANCES

The invention relates to an actively shielded superconducting magnet arrangement for the generation of a magnetic field in the direction of a z-axis in a working volume, arranged about z=0, having two coil systems, a radially inner and a radially outer one, wherein both coil systems carry approximately the same current and have dipole moments of approximately the same magnitude, but opposite in direction, wherein at least parts of the radially outer coil system are electrically connected in series with the radially inner coil system, and wherein a first superconducting switch is provided which can cause, in the operating state, a superconducting short-circuit of a first current path of the magnet arrangement.

An actively shielded superconducting magnet arrangement of this type is known from U.S. Pat. No. 5,426,366.

The field of use of superconducting magnets comprises various fields of application, in particular magnet resonance methods, in which in general the stability with time of the magnetic field is important. The most demanding applications comprise high-resolution nuclear magnetic resonance spectroscopy (NMR spectroscopy). Field fluctuations with time may be caused by the superconducting magnet itself as well as by its surroundings. While it is possible with the current magnet and conductor technology to generate fields which are very stable with time, there is still the need for further development in the field of suppressing external magnetic disturbances. In the following, methods are shown about how these disturbances can be counteracted. The main focus lies in the field of compensating disturbances in the case of superconducting solenoid magnets with active shielding of the stray field.

U.S. Pat. No. 4,974,113 describes i.a. a compensating, superconducting solenoid magnet, wherein there is no mention of any active shielding of the magnet system. The idea there consists in that at least two independent superconducting current paths are realized by means of two coaxially arranged superconducting solenoid coils and are calculated such that occurring external magnetic field disturbances are suppressed to at least 80% in the inside of the arrangement by taking into consideration the invariance of the entire magnetic flux through each closed superconducting current path.

U.S. Pat. No. 5,329,266 describes an application of this idea to an actively shielded magnet system. It provides a plurality of shielding structured compensation coils which are connected in series in a superconducting manner and comprise each individually a current limiter with a maximum current which is small in relation to that of the main coils, in the range of a maximum of one ampere, to ensure that in case of a breakdown of the superconductivity (=Quench), the stray magnetic field generated by the magnet arrangement on the outside, remains as small as possible.

U.S. Pat. No. 4,926,289 shows an alternative approach, in which an actively shielded superconducting magnet system having a radially inner and a radially outer coil system which are connected in a superconducting manner, is described, wherein a superconducting short-circuit with a current limiter is provided between the inner and the outer coil system in order to keep the difference current in a reasonable range. Compensation of external disturbances is made possible in that the superconducting current limiter enables a shift of the current distribution between the radially inner and the radially outer superconducting current path between the two coil systems. In case of a Quench, the small current capacity of the differential current limiter is to ensure that the external stray field generated by the magnet arrangement remains small.

The problem of compensation of external magnetic field disturbances with actively shielded magnet systems is thus solved by the above-described prior art either by means of one or several compensation coils provided in addition to the field coils or by dividing the coil system into superconductingly short-circuited sections, in such a manner that homogeneous outer magnetic field disturbances in the working volume of the respective magnet system are reduced to less than 20% in their long-term behaviour.

The initially cited U.S. Pat. No. 5,426,366 describes a further improvement with respect to the magnet system according to U.S. Pat. No. 4,926,289. According to this paper, the differential current limiter is to be designed as partial short-circuit through a section of the radially inner coil system. The fact that the connection points of the differential current limiter do not extend between the two ends of the radially inner coil system, as is the case with U.S. Pat. No. 4,926,289, but that connecting points can be placed at a distance from the coil ends over a partial section of the radially inner coil system, achieves additional flexibility for the optimization of the compensation of disturbances of the system. Further flexibility may be gained by dividing the differential current limiter into several partial sections above the radially inner coil system.

However, a disadvantage of the magnet system according to U.S. Pat. No. 5,426,366 consists in that the partial section of the radially inner coil system is inductively coupled with the rest of the magnet system. This coupling can lead to undesired side effects like an increase of the magnet drift or uncontrolled charging of the section (leading to distortions of homogeneity with time, possible increase of the stray field, charging up to quenching). As preventive measures for these problems, a current limiter is introduced. However, the current limiter has the disadvantage that it can reduce to zero flowing current. The decay of this current is a disturbance that the magnet cannot compensate.

In contrast thereto, it is the object of the present invention to modify a magnet arrangement of the initially mentioned type by simple measures such that the above-mentioned disadvantages are avoided.

According to the invention, this object is achieved in that a section of the radially outer coil system, which during operation can be short-circuited in a superconducting manner via a further superconducting switch, is arranged symmetrically to the plane z=0 and that the further superconducting current path formed by the superconductingly short-circuited section of the radially outer coil system is essentially inductively decoupled from the other parts of the magnet arrangement which are connected in series.

In case there are several inductively coupled superconducting current paths present in a superconducting magnet system, undesired side effects may occur like an increase of the magnet drift, uncontrolled charging of a current path and resulting distortion with time of the homogeneity, a possible increase of the stray field, charging up to quenching, dissipation of energy in switches when charging the magnet system, large excess currents in a current path in case of a quench of a different current path etc. These problems are solved according to the invention by the mutual inductive decoupling of the superconducting current paths. A section inductively decoupled from the rest of the magnet is typically located in the innermost layers of the outer coil system. Thus, the undesired side effects of the coupling are eliminated and the current limiter provided according to prior art is no longer required.

In reality one has always to take into account a remaining coupling due to production inaccuracies. Therefore, in case of a quench of one of the superconducting current paths, it is nevertheless possible to induce a current into a different current path. In order to avoid high electromagnetic forces in case of a quench, the section has to have the same plane and axis of symmetry as the entire magnet.

The superconductingly short-circuited section of the radially outer coil system may also be divided into several subsections. By means of a finer division of the current paths into many sections, the behaviour of the compensation of disturbances is further improved with respect to known magnet systems since still more flexibility is provided for optimizing the disturbance behaviour.

The above-mentioned advantages of the invention are particularly useful with sensitive systems. For this reason, in a preferred embodiment, the magnet arrangement according to the invention is part of an apparatus for high-resolution magnetic resonance spectroscopy, e.g. in the field of NMR, ICR or MRI.

NMR apparatus normally comprise a device for stabilizing the magnetic field generated in the working volume. This device utilizes a lock coil for correction as well as an NMR signal for the detection of field disturbances and is designated as NMR lock.

However, it should be guaranteed that existing active devices for compensating magnetic field fluctuations, like e.g. said NMR lock do not interact with the interference suppression concept of the magnet according to the invention. For this reason, in a further development of the above-mentioned embodiment it is provided that the superconducting current path of the short-circuited section is largely decoupled from the lock coil. The advantage of inductive decoupling of the superconducting current paths from the lock coil consists in that the effect of the NMR lock is not impeded by the magnet and in that the interaction of the field lock with the entire magnet system is not influenced by providing the additional switch.

In case the magnetic field is to be modulated with sweep coils, which is known per se from prior art, said modulation must not be compensated by the magnet like an external disturbance. In a different development of the invention, the superconducting current path of the short-circuited section is thus largely decoupled from the sweep coils. The advantage of inductive decoupling from the sweep coils consists in that the magnet is transparent for the sweep field and that the interaction of the sweep coils with the entire magnet system is not influenced by providing the additional switch.

Of particular importance is an embodiment of the invention in which the superconducting short-circuited section consists of the n radially innermost layers of the outer coil system, wherein preferably n<4. Indeed, decoupling from the rest of the magnet arrangement can be realized in the simplest way by short-circuiting the radially innermost layers of the radially outer coil system.

By decoupling the short-circuited section from the rest of the magnet arrangement it is achieved that with an external field fluctuation, both parts of the magnet arrangement react independently from one another, i.e. the generated total compensation field is the sum of the individual compensation fields of both parts. In case the short-circuited section comprises only a small portion of the windings of the stray field shielding, the behaviour of the rest of the magnet arrangement with respect to an external field fluctuation is approximately like that of a magnet with active stray field shielding, i.e. no compensation at all. In contrast thereto, e.g. a thin current-carrying cylindrical surface behaves approximately like an ideal shield with respect to magnetic disturbances. A magnet arrangement consisting of a non-compensating part and a section that has been ideally inductively decoupled from the latter behaves altogether like an ideally disturbance-compensated system.

For this reason, it is of advantage if the short-circuited section is formed such that upon occurrence of an in particular homogeneous external magnetic field disturbance, same is largely compensated in the working volume of the magnet arrangement.

Further flexibility for optimizing the inventive magnet arrangement with respect to external field disturbances is achieved if a compensation coil which is not galvanically connected with the two coaxial coil systems is arranged coaxially with respect to the two coil systems and forms an additional current path which is superconducting during operation.

Further flexibility for optimizing the compensation behaviour of the magnet arrangement is achieved with a solution that does not require any additional coils. It consists in that at least one additional section of the inner and/or outer coil system of the actively shielded magnet can be short-circuited via an additional superconducting switch and thus forms an additional current path which, in the operative state, is superconducting.

Since the superconductingly short-circuited section is part of the field-generating magnet arrangement, the entire operating current should flow also in this section during operation. This is achieved in a preferred manner in that all coil parts of the magnet arrangement are connected in series, in particular the superconductingly short-circuited section, with the rest of the magnet arrangement. With open switches, the same current flows in the entire arrangement during the charging phase of the magnet arrangement due to the continuity equation, i.e. the entire arrangement reaches simultaneously the operating current.

In the following, two concrete realization variants of the wiring of a magnet arrangement according to the invention will be given:

If various superconducting current paths are wound e.g. on different magnet sections, it is easier to connect them only in a resistive manner. This resistive connection allows common charging. An embodiment in which at least one part of the current paths which are superconductingly short-circuited during operation, are connected resistively with one another, is thus advantageous for the production.

A second simple embodiment, in which the current paths which are superconductingly short-circuited during operation, are superconductingly connected in series, is also easy to realize by technical means.

A preferred further development of the last-mentioned embodiment provides that the superconductingly short-circuited section of the radially outer coil system comprises a current limiter connected in parallel with said section and connected in series with the further superconducting switch. The current limiter presents safety with respect to undesired long-term effects since only limited differential currents may flow between the superconductingly short-circuited section and the rest of the magnet arrangement.

During the charging of parts of the magnet arrangement, it is possible that several of the superconductingly short-circuited paths must be supplied with current, i.e. their switches have to be heated simultaneously. In other superconductingly short-circuited current paths, like e.g. compensation coils, shims etc. it is necessary to permanently reduce an induced current, where applicable, via the switch, for which reason the switches of these current paths have to be heated, too. Therefore, one further development of the magnet arrangement according to the invention is preferred, in which the heating devices of at least two superconducting switches are electrically connected in series. The advantage of said arrangement consists in that the connection in series of switch heaters, the number of heating current leads in the current rod can be reduced and that the handling of the magnet arrangement becomes easier and safer.

During the charging of a shim coil it is possible to induce a differential current between the superconductingly short-circuited section and the rest of the magnet arrangement. In case the superconductingly short-circuited section and the rest of the magnet arrangement are superconductingly connected in series, the differential current flows via the switch of the superconductingly short-circuited section and can be reduced by opening said switch. For this reason, an arrangement is advantageous in which the switch heater of the section is connected in series with the shim switch heater. In this manner, during charging of the shim, when the associated superconducting switch is heated, the switch of the section is automatically heated, too.

In a preferred further development the heating device of at least one superconducting switch can be heated separately. In this way, the advantages of the series connection of the heaters, like e.g. the simple handling can be utilized, but it is still possible to charge the superconducting current paths individually by means of a switch which, in addition, can be heated separately. Furthermore, the induced currents can be eliminated at any time by heating of the switch.

A particularly preferred embodiment of the magnet arrangement according to the invention is characterized in that the superconductingly short-circuited section has such a geometric shape and dimension that the homogeneity of the magnetic field generated by the magnet arrangement is essentially maintained in the working volume when external magnetic field disturbances occur. The advantage consists in that the field in the working volume does not vary in terms of time nor location during an external field fluctuation.

A further advantageous embodiment finally utilizes, for the inductive decoupling of the current path formed by the superconductingly short-circuited section from the other parts of the magnet arrangement connected in series, a different polarity of the radially inner and the radially outer coil system. By utilizing the different polarity of the radially inner and the radially outer coil system for decoupling the superconductingly short-circuited section from the rest of the magnet arrangement, one can do without coils of different polarities in the superconductingly short-circuited section.

Further advantages of the invention can be taken from the description and the drawing. The features mentioned above and below can be utilized in accordance with the invention individually or in any arbitrary combination with one another. The embodiments shown and described are not to be understood as exhaustive enumeration but rather have exemplary character for describing the invention.

Figure 3:
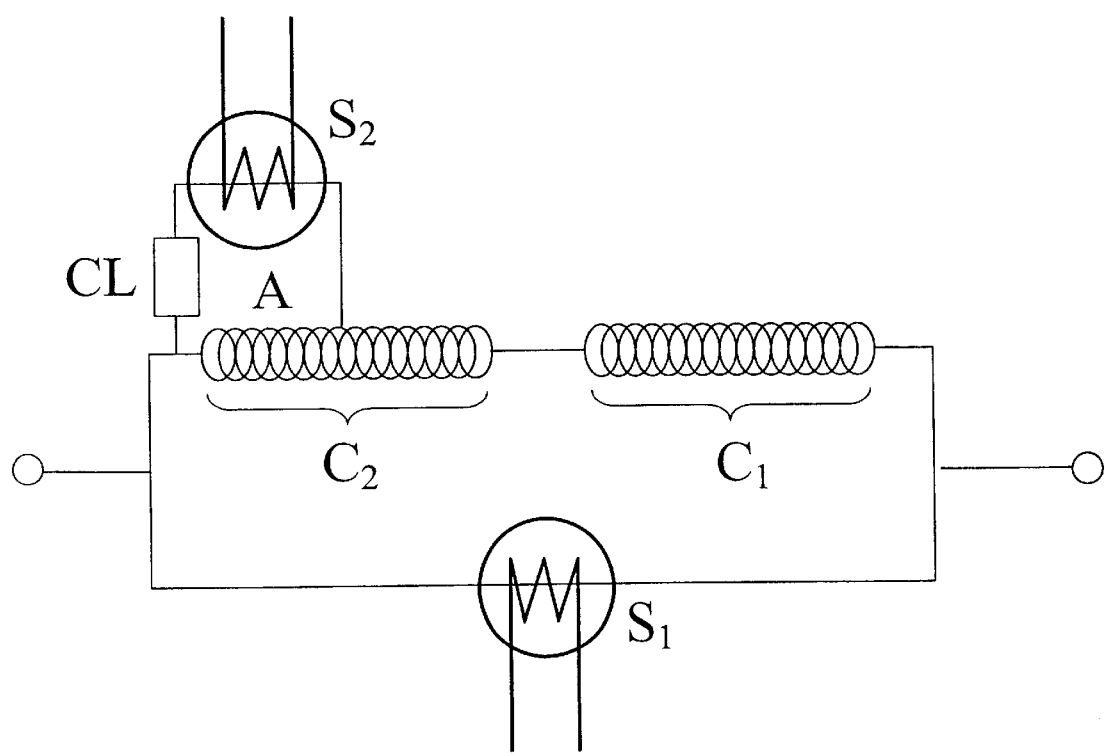
Figure 2:
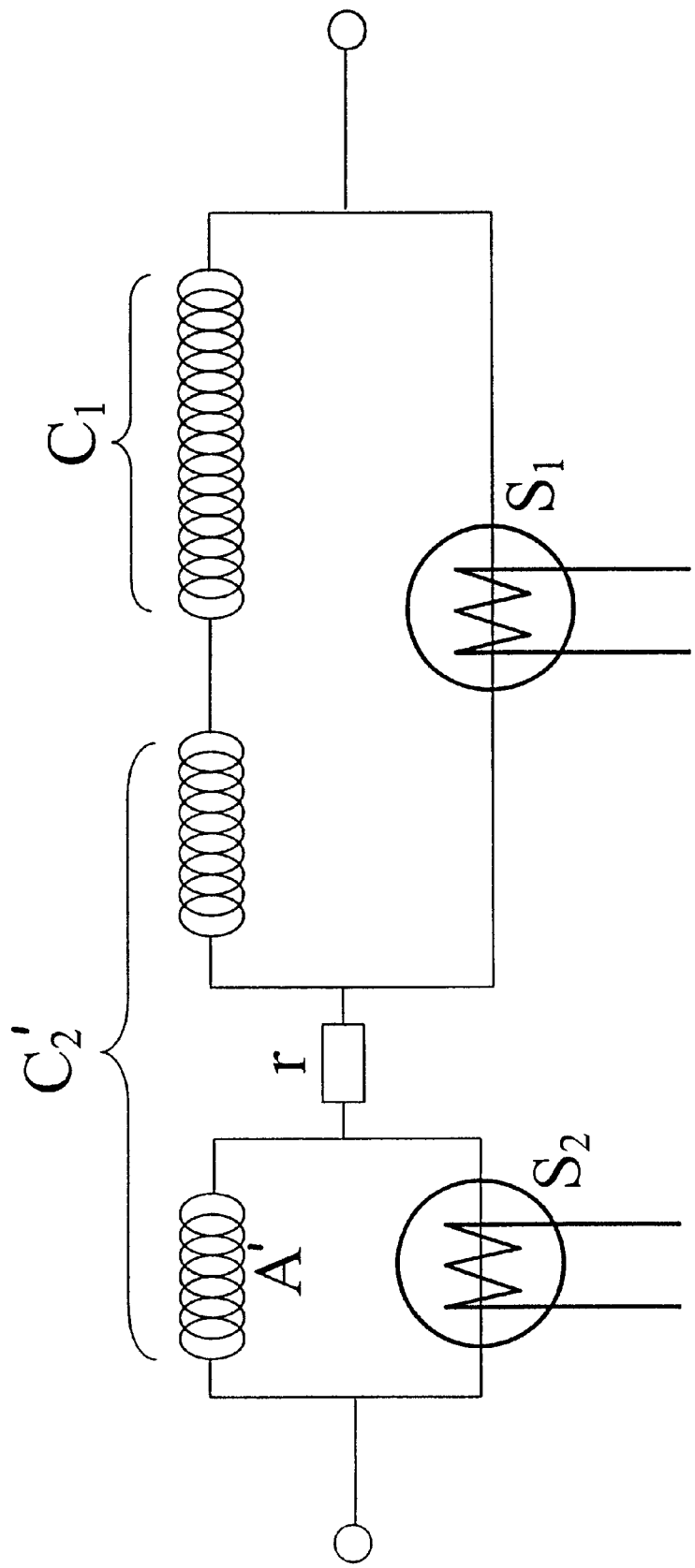

The invention is shown in the drawing and is explained in more detail by means of the embodiments. In the drawing:

FIG. 1 shows a wiring diagram of a first embodiment of the magnet arrangement according to the invention with superconducting connections of the superconductingly closed current paths;

FIG. 2 a further embodiment with resistive connections of the superconductingly closed current paths; and FIG. 3 a third embodiment with integrated current limiter in the superconductingly short-circuited section of the radially outer coil system.

Figure 4:
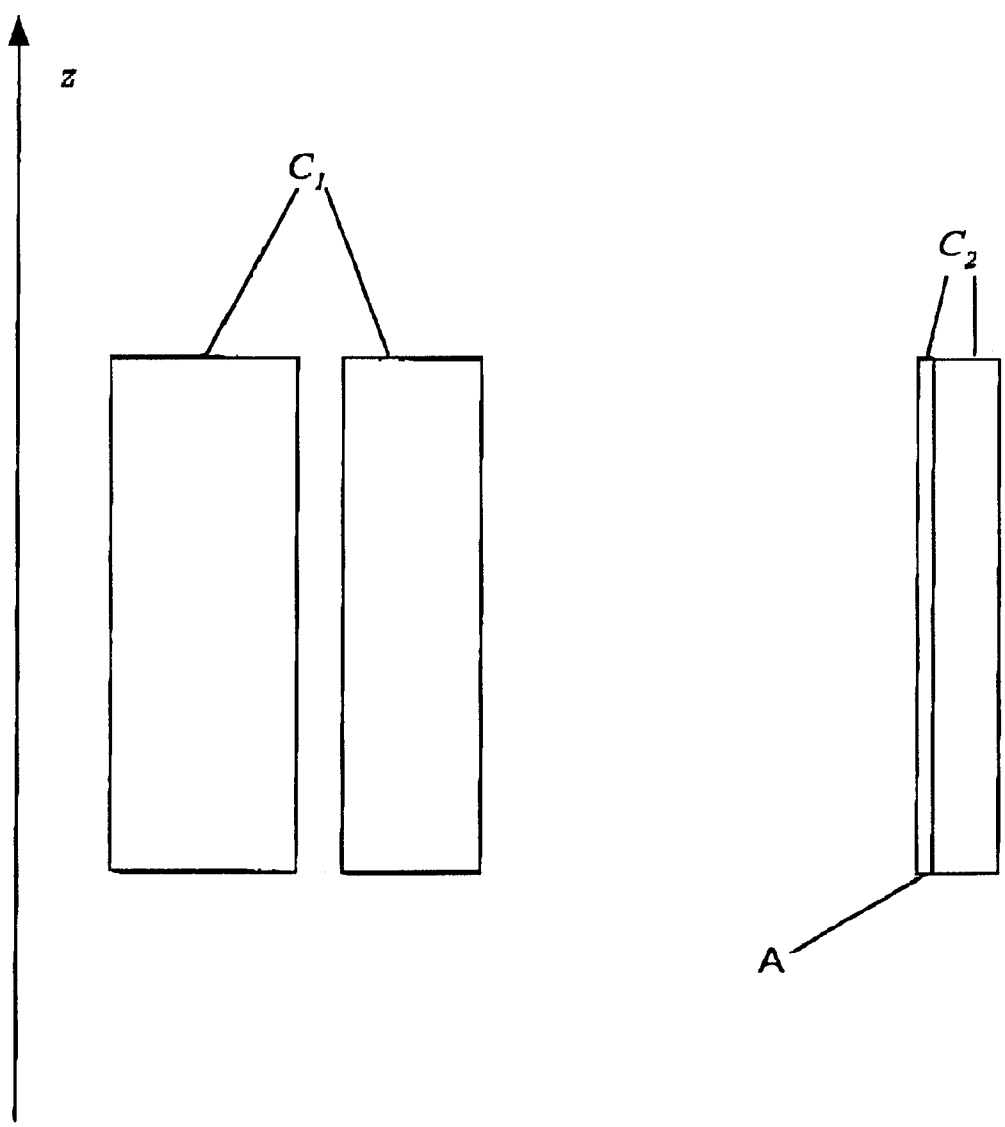

FIG. 4 shows a cross sectional view through one radial half of the coil systems according to the invention.

In the following we will look at a superconductingly short-circuited coil and its behaviour when external magnetic field fluctuations occur. According to Lenz's law, the following holds:

$$L \frac{dI}{dt} = -\frac{d\Phi}{dt}$$

with the following values:
L: Self inductance of the coil
I: Current through the coil
$\Phi = \int B(r,z,\phi) dS$: Magnetic flux of the external field fluctuation through the coil $\frac{d\Phi}{dt}$ : change with time of the magnetic flux The variation with time of the current in the coil is thus proportional to the variation with time of the flux of the external field fluctuation, i.e.

$$\Delta I = -\Phi$$

As a measure of the sensitivity of a coil system, we define the beta factor $\beta$ as the ratio between the resulting $B_z$ field change in the magnetic centre (=superposition of the $B_z$ component of the disturbance and of the compensation field built up by the magnet) and the $B_z$ component of the disturbance. The beta factor describes the capacity of a magnet to compensate external disturbances in the magnetic centre. If e.g. $\beta=0$, the disturbance in the magnetic centre is invisible. $\beta>0$ means that the induced currents compensate the disturbance insufficiently. $\beta<0$ means in contrast thereto, that the induced currents are that large that the disturbance in the magnetic centre is over-compensated.

If $B_z$ designates the z component of the disturbance field in the magnetic centre (without compensation current of the coil systems) and b is the magnetic field of the coil per ampere of current in the magnetic centre, the beta factor is as follows:

$$\beta = 1 + \frac{b \cdot \Delta I}{B_Z} = 1 - \frac{b \cdot \Delta \Phi}{L B_Z}$$

Now, we define the "effective area" A of the coil with respect to the disturbance as $$A = \frac{\Delta \Phi}{B_Z}$$

In case of homogeneous field fluctuation this is simply the area enclosed by the coil.

The beta factor can be simplified now as:

$$\beta = 1 - \frac{b}{L} \cdot A$$

If a magnet consists of one single superconducting coil, its capacity to compensate external field fluctuations is in most cases not ideal. This is in particular the case with actively shielded magnets since in that case the effective area A is small, which leads to insufficient compensation of disturbances ($\beta>0$). The magnet is practically transparent for disturbances.

One can improve the situation by either short-circuiting a section of the magnet separately via a superconducting switch or by introducing an additional superconducting coil. In any case the number of superconducting circuits is increased and thus more flexibility for optimizing the disturbance behaviour is achieved.

In case of several superconducting current paths it is advisable to decouple same inductively. In particular with actively shielded magnets there is otherwise the danger of an increase of the stray field if the magnet drifts or if the main switch opens and the magnetic current slowly decays.

In case decoupling is not possible, either a small resistance or a current limiter has to be installed in the additional superconducting current paths.

If the n superconducting current paths are decoupled from one another, the beta factor becomes simply i.e. there is an additive superposition of the compensation fields of all current paths.

In case of an actively shielded magnet there must be a place where a coil couples equally strongly with the negatively polarized and with the positively polarized part of the magnet. The resulting coupling with the entire magnet equals zero. It is often the case that the first few layers of the shielding fulfill said condition. If one short-circuits these layers via a superconducting switch, one achieves in most cases decoupling and at the same time good compensation of external field fluctuations.

In most cases, realistic external field fluctuations are relatively homogeneous. However, if the magnetic fields of the superconducting current paths are not homogeneous individually, it is possible that an external field fluctuation leads to a distortion of the homogeneity in the working volume due to the induced currents. One has to take care that the magnetic field of each superconducting current path is homogeneous for itself.

In case of the magnet systems of interest to us, the magnet coils are all coaxial (the common axis shall be designated as z-axis) and symmetrically arranged about the plane z=0. It is important that these symmetries are also present with short-circuited sections or additional coils. Otherwise it might be the case that the current distribution in the case of a quench becomes unsymmetrical. Unsymmetrical current distributions generate undesired unsymmetrical Lorentz forces which could cause damages with large magnets.

It is to be recommended that the heaters of the switches of the additional superconducting current paths are connected in series with the main switch heater of the magnet. In this way it is guaranteed that, during charging and discharging of the magnet with open main switch, the other switches are also open. The remaining couplings, where applicable, between additional superconducting current paths and the magnet cannot lead in this manner to charging of said paths.

For test purposes it is reasonable to provide that the heaters of the switches of the additional superconducting paths can be activated separately. In this way, it is possible to e.g. determine the couplings of the various paths by experiments or introduce various currents into the various paths.

The inventive superconducting magnet arrangement can be realized by various wiring schemes. Three concrete embodiments are shown in the drawings 1 through 3, wherein in principle the parts having the same functions are designated with the same reference numbers.

The embodiments show in each case a radially inner coil system $C_1$, a radially outer coil system $C_2$ or $C_2'$ with superconductingly short-circuited section A or A' as well as two superconducting switches $S_1$ and $S_2$. The main switch of the magnet arrangement via which at least parts of both coaxial coil systems $C_1$ and $C_2$ or $C_2'$ can be superconductingly short-circuited, is the switch $S_1$. The switch $S_2$ in contrast short-circuits only the superconducting section A or A'. A cross sectional view through one radial half of the coil systems according to the invention is shown in FIG. 4.

In the embodiments according to FIGS. 1 and 3 the superconductingly short-circuited section A is connected directly in a superconducting manner with the other parts of the radially outer coil system $C_2$ in each case.

As an alternative, as shown in FIG. 2, the superconductingly short-circuited section A' may be connected in series with the other parts of the radially outer coil system $C_2'$ but also resistively through a normally conducting connection piece r.

It is to be pointed out that the normally conducting connection piece r in FIG. 2 is merely shown as auxiliary resistance to distinguish it from the embodiment according to FIG. 1. In practice one will not realize the connecting piece r by means of a resistance in the sense of an electric component but by a simple normally conducting line section, e.g. of copper wire.

FIG. 3 finally shows an embodiment similar to FIG. 1 in which, however, a current limiter is integrated in the current path of the superconductingly short-circuited section A'.

What is claimed is:

1. An actively shielded superconducting magnet arrangement for the generation of a magnetic field in the direction of a z axis in a working volume disposed about z=0, the arrangement comprising:

a first radially inner coil system ($C_1$) carrying a first current and having a first dipole moment;

a second radially outer coil system ($C_2$ resp. $C_2'$) disposed coaxially about said first coil and carrying a current approximately equal to said first current, said second coil system having a second dipole moment approximately equal but opposite in direction to said first dipole moment, wherein at least parts of said second coil system ($C_2$ resp. $C_2'$) are electrically connected in series with said first coil system ($C_1$);

a first superconducting switch ($S_1$) to short-circuit a first current path of the magnet arrangement comprising at least said first radially inner coil system, said first path being superconducting during operation; and a second superconducting switch ($S_2$) to short circuit a section ($A_2$ resp. $A_2'$) of said second coil system ($C_2$ resp. $C_2'$) thus forming a second current path in such a way that each winding of said second coil system is part of at least one of said first and second current path, wherein said second current path is superconducting during operation and is substantially inductively decoupled from said first current path, said section being disposed symmetrically with respect to z=0.

2. The magnet arrangement of claim 1, wherein the magnet arrangement is part of an apparatus for high-resolution magnetic resonance spectroscopy.

3. The magnet arrangement of claim 2, wherein the magnetic resonance apparatus is equipped with a device for locking the magnetic field generated in the working volume, which is substantially inductively decoupled from said section (A resp. A').

4. The magnet arrangement of claim 2, wherein the magnetic resonance apparatus comprises sweep coils which are substantially inductively decoupled from said section (A resp. A').

5. The magnet arrangement of claim 1 wherein said section (A resp. A') consists of the n radially innermost layers of said second coil system, ($C_2$ resp. $C_2'$) and wherein preferably $n \leq 4$.

6. The magnet arrangement of claim 1, wherein said section (A resp. A') is formed such that an external magnetic field disturbance is substantially compensated in the working volume of the magnet arrangement, in particular if said field disturbance is homogeneous.

7. The magnet arrangement of claim 1 wherein at least one additional section of said first or said second coil system can be short-circuited via an additional superconducting switch and in this way forms an additional superconducting current path during operation.

8. The magnet arrangement of claim 1 wherein said first and said second superconductingly short circuited current paths are connected resistively to one another.

9. The magnet arrangement of claim 1 wherein said first and said second superconductingly short circuited current paths are connected superconductingly to one another.

10. The magnet arrangement of claim 9 wherein said section (A) comprises a current limiter (CL) connected in parallel with said section (A) and connected in series with said second superconducting switch ($S_2$).

11. The magnet arrangement of claim 9, wherein said second superconducting switch ($S_2$) comprises a heater which is additionally electrically connected in series with the heater of the superconducting switch of a shim.

12. The magnet arrangement of claim 11, wherein the heater of said first or said second superconducting switch ($S_1$, $S_2$) can be activated separately.

13. The magnet arrangement of claim 1, further comprising a compensation coil galvanically isolated from and arranged coaxially with respect to said first coil system ($C_1$) and said second coil system ($C_2$ resp. $C_2'$), forming an additional current path which is superconductingly short-circuited during operation. system ($C_1$) and said second coil system ($C_2$ resp. $C_2'$), forming an additional current path which is superconductingly short-circuited during operation.

14. The magnet arrangement of claim 1, wherein the heaters of at least said first and said second superconducting switch ($S_1$, $S_2$) are electrically connected in series.

15. The magnet arrangement of claim 14, wherein the heater of said first or said second superconducting switch ($S_1$, $S_2$) can be activated separately.

16. The magnet arrangement of claim 1, wherein said section (A resp. A') is geometrically shaped and dimensioned such that the homogeneity of the magnetic field in the working volume generated by the magnet arrangement is largely maintained when an external magnetic field disturbance occurs.

17. The magnet arrangement of claim 1, wherein the inductive decoupling of said section (A resp. A') from said first current path is achieved using a different polarity of said first coil system ($C_2$ resp. $C_2'$).

* * * * *

UNITED STATES PATENT AND TRADEMARK OFFICE
CERTIFICATE OF CORRECTION

PATENT NO.    : 6,369,464 B1
DATED         : April 9, 2002
INVENTOR(S)   : Schauwecker et al.

It is certified that error appears in the above-identified patent and that said Letters Patent is hereby corrected as shown below:

Column 10,
Line 6, after "operation." delete -- system ($C_1$) and said second coil system ($C_2$ resp. $C_2'$), forming an additional current path which is superconductingly short-circuited during operation --.

Signed and Sealed this

Twenty-fifth Day of June, 2002

Attest:

JAMES E. ROGAN
Attesting Officer    Director of the United States Patent and Trademark Office